(12) United States Patent
Singhal et al.

(10) Patent No.: US 11,899,954 B2
(45) Date of Patent: Feb. 13, 2024

(54) MEMORY WITH EXTENSION MODE

(71) Applicant: TEXAS INSTRUMENTS INCORPORATED, Dallas, TX (US)

(72) Inventors: Shobhit Singhal, Bengaluru (IN); Ruchi Shankar, Bengaluru (IN); Sverre Brubaek, Oslo (NO); Praveen Kumar N, Bengaluru (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/590,884

(22) Filed: Feb. 2, 2022

(65) Prior Publication Data

US 2023/0244396 A1 Aug. 3, 2023

(51) Int. Cl.
*G06F 3/06* (2006.01)
(52) U.S. Cl.
CPC .......... *G06F 3/0635* (2013.01); *G06F 3/0619* (2013.01); *G06F 3/0673* (2013.01)
(58) Field of Classification Search
CPC ..... G06F 3/0635; G06F 3/0619; G06F 3/0673
See application file for complete search history.

(56) References Cited

U.S. PATENT DOCUMENTS

| | | | |
|---|---|---|---|
| 2006/0218467 A1* | 9/2006 | Sibigtroth | G11C 29/52 714/763 |
| 2020/0151053 A1* | 5/2020 | Cha | G06F 11/1044 |
| 2021/0294692 A1* | 9/2021 | Chen | G06F 9/30189 |
| 2023/0054754 A1* | 2/2023 | Oh | G06F 11/1068 |

FOREIGN PATENT DOCUMENTS

| | | | | |
|---|---|---|---|---|
| CN | 111143109 A | * | 5/2020 | G06F 11/1044 |
| WO | WO-2022120586 A1 | * | 6/2022 | |

* cited by examiner

*Primary Examiner* — Edward J Dudek, Jr.
(74) *Attorney, Agent, or Firm* — Brian D. Graham; Frank D. Cimino

(57) ABSTRACT

A memory system includes a main memory, an auxiliary memory, a redundancy circuit, an extension control terminal, and a multiplexer. The main memory has a line width, and includes a write data input. The auxiliary memory has the same line width as the main memory, and includes a write data input. The redundancy circuit includes and input and an output. The input is coupled to the write data input of the main memory. The multiplexer includes a first input, a second input, a control input, and an output. The first input is coupled to the write data input of the main memory. The second input is coupled to the output of the redundancy circuit. The control input is coupled to the extension control terminal. The output of the multiplexer is coupled to the write data input of the auxiliary memory.

20 Claims, 5 Drawing Sheets

MEMORY WITH EXTENSION MODE

BACKGROUND

In electronic systems, memory (e.g., static random access memory (SRAM), dynamic random access memory (DRAM), etc.) is often provided to store instructions and/or data. To enhance reliability, the memory may include storage for redundancy information that is used to detect faults or data value changes in one or more bit cells of the memory. Parity and error correction codes (ECC) are two commonly used methods for providing redundancy. The storage provided for redundancy information is in addition to the storage provided for data and/or instructions. For example, for a 32-bit data value, four additional bits of parity storage are required if byte-wise parity is implemented. For a 64-bit data value, eight additional bits are needed for an 8-bit ECC code that provides single-bit error correction or double-bit error detection.

SUMMARY

In one example, a memory system includes a main memory, an auxiliary memory, a redundancy circuit, an extension control terminal, and a multiplexer. The main memory has a line width, and includes a write data input. The auxiliary memory has the same line width as the main memory, and includes a write data input. The redundancy circuit includes and input and an output. The input is coupled to the write data input of the main memory. The multiplexer includes a first input, a second input, a control input, and an output. The first input is coupled to the write data input of the main memory. The second input is coupled to the output of the redundancy circuit. The control input is coupled to the extension control terminal. The output of the multiplexer is coupled to the write data input of the auxiliary memory.

In another example, a memory system includes a main memory and an auxiliary memory. The main memory is configured to store application data. The auxiliary memory is configured to store redundancy data responsive to selection a redundancy mode, and store application data responsive to selection of an extension mode.

In a further example, a method includes writing an application data value to a main memory based on an address value being no more than a predetermined value. The method also includes writing a redundancy value to an auxiliary memory based on the address value being no more than the predetermined value and selection of a redundancy mode. The method further includes writing the application data value to the auxiliary memory based on the address value being greater than the predetermined value and selection of an extension mode.

BRIEF DESCRIPTION OF THE DRAWINGS

For a detailed description of various examples, reference will now be made to the accompanying drawings in which.

DETAILED DESCRIPTION

Figure 1:
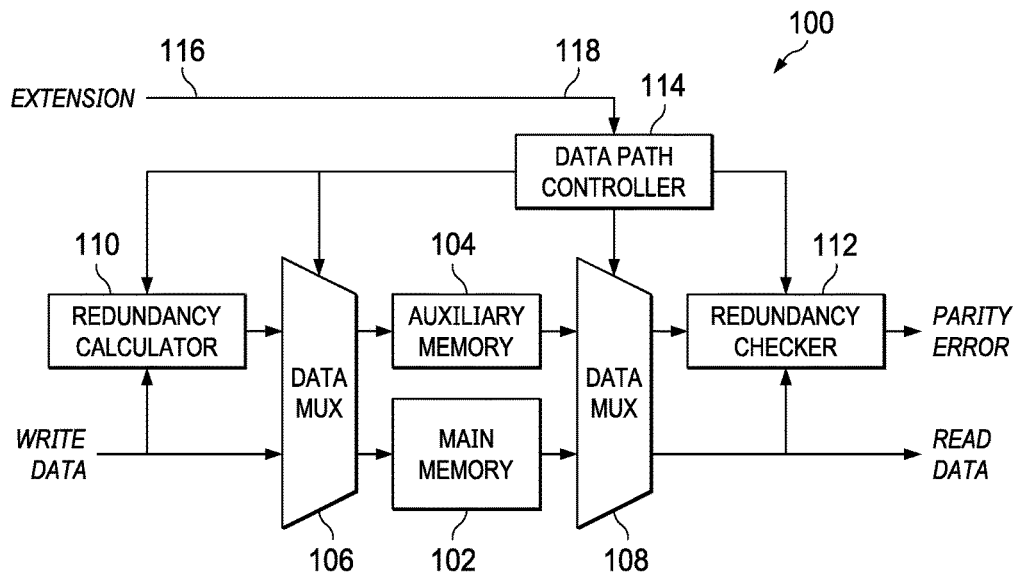
FIG. 1 is a block diagram of an example memory system that includes an auxiliary memory configured to selectably store redundancy data or application data.

The use of redundancy to enhance memory reliability requires the implementation of storage in addition to the storage dedicated to data. For example, the additional storage required for redundancy information may increase the total memory size by one-eighth in some implementations. The operational requirements of some applications do not depend on the use of redundancy. In such applications, the additional storage dedicated to redundancy is unused.

In the memory systems disclosed herein, in applications that do not need redundancy, the memory applied to store redundancy information may alternatively be used for data storage. Thus, the size of the memory available for data storage may be increased in cases don't need redundancy. The memory systems include a main memory, and an auxiliary memory. The auxiliary memory is organized to store redundancy information and data.

In some memory systems, redundant bits are computed along with application data and written to memory at the same time as the application data. The word line bit-size is increased to provide storage for the redundant bits. For example, 32 kilo-bytes (KB) of storage can be organized as 64×4096 (Word Bit Size x Number of Lines) and application data with redundant bits can be stored in memory organized as 72×4096 configuration (36 KB), where 8-bits are added to each line for storage of the redundant bits. This memory organization leaves only 32 KB available for storage of application data. The additional 8-bits of each memory line is unused with redundancy is not required.

In the memory system of the present disclosure, the redundant bits are stored in a separate memory (auxiliary memory) having a word line bit-size that is the same as the main memory. For example, if the main memory is organized as 64×4096, then the auxiliary memory may be organized as 64×512. More generally, if the main memory is X KB is size, then the auxiliary memory may be X/8 KB in size. By organizing memory in this way, the memory system can utilize the auxiliary memory for storage of application data or redundancy data.

The memory system may also include main memory and auxiliary memory buffer circuitry to reduce memory system power consumption by reducing the number of accesses to the main and/or auxiliary memories. All transactions to the auxiliary memory are bit/byte oriented as one word of the auxiliary memory stores redundant bits for more than one word of the main memory. For linear or consecutive or within 32 bit/64 bit read transactions on main memory, a same word will be read from auxiliary memory. For example, 8 consecutive read address transactions will fetch redundancy data from the same word in auxiliary memory though bit locations will be different. With the memory buffer circuitry, the auxiliary memory may be read once in 8 cycles and after the first read transaction reads to the auxiliary memory are gated and redundancy bits are directly supplied from buffer circuitry. For byte-wise read transactions in the main memory, read transactions to memory are gated if data is already available in the buffer. Buffering in the main memory path may be optional.

FIG. 1 is a block diagram of an example memory system 100 that includes an auxiliary memory configured to selectably store redundancy data or application data. The memory system 100 includes a main memory 102, an auxiliary memory 104, a write data multiplexer 106, a read data multiplexer 108, a redundancy calculator 110, a redundancy checker 112, a data path controller 114, and an extension control terminal 116. The auxiliary memory 104 is an N row, M column memory array, and the main memory 102 is an X*N row, M column memory array. For example, the auxiliary memory 104 may be a 512 by 64 memory array (512 rows and 64 columns (64 bit line width)), and the main memory 102 may be 4096 by 64 memory array (4096 rows and 64 columns). The memory system 100 operates in either of two modes—redundancy mode and extension mode as selected by a control signal 118 (EXTENSION) provided at the extension control terminal 116. In both redundancy mode and extension mode, the main memory 102 stores application data (e.g., data generated by circuitry external to the memory system 100. In redundancy mode, the auxiliary memory 104 stores redundancy data (e.g., parity bits or ECC codes) generated by the memory system 100 for each write to the main memory 102. Each row of the auxiliary memory 104 may store redundancy data for multiple rows of the main memory 102. For example, if the memory system 100 generates a parity bit for each byte of the main memory 102, then each row of the auxiliary memory 104 may store parity bits for eight rows of the main memory 102. In extension mode, the auxiliary memory 104 operates as an extension of the main memory 102, and stores application data. For example, in extension mode, a lowest addressable storage location of the auxiliary memory 104 may be an address bit higher than the highest addressable storage location of the main memory 102.

The redundancy calculator 110 generates the redundancy data for storage in the auxiliary memory 104 based on the application data received by the memory system 100 for storage in the main memory 102. For example, the redundancy calculator 110 may include circuitry for generating parity bits or ECC codes. The redundancy checker 112 analyzes, with each read of the main memory 102, the application data read from the main memory 102 and the redundancy data read from the auxiliary memory 104 to determine whether the application data values have changed. For example, the redundancy checker 112 may recompute the redundancy data based on the application data fetched from the main memory 102, and compare the recomputed redundancy data to the redundancy data read from the auxiliary memory 104 to validate the application data.

The write data multiplexer 106 is coupled to the redundancy calculator 110, the auxiliary memory 104, and the main memory 102. The write data multiplexer 106 receives redundancy data from the redundancy calculator 110, and passes the redundancy data to the auxiliary memory 104 when the memory system 100 is operating in redundancy mode. The write data multiplexer 106 receives application data generated external to the memory system 100, and passes the application data to the main memory 102 or the auxiliary memory 104 based on the operational mode (redundancy or extension) of the memory system 100. When operating in the redundancy mode, the write data multiplexer 106 passes application data to the main memory 102. When operating in the extension mode, the write data multiplexer 106 passes application data to the auxiliary memory 104 if the address to be written is greater than the highest address of the main memory 102, and otherwise passes the application data to the main memory 102.

The read data multiplexer 108 is coupled to the redundancy checker 112, the auxiliary memory 104, and the main memory 102. When the memory system 100 is operating in redundancy mode, the read data multiplexer 108 receives redundancy data from the auxiliary memory 104, and receives application data from the main memory 102. The read data multiplexer 108 passes the redundancy data to the redundancy checker 112 for use in validating the application, and passes the application data to an output of the memory system 100 for use by circuitry external to the memory system 100. When the memory system 100 is operating in the extension mode, the read data multiplexer 108 receives application data from the main memory 102 and the auxiliary memory 104, and passes the application data to circuitry external to the memory system 100. When operating in the extension mode, the write data multiplexer 106 passes application data received from the auxiliary memory 104 to the output of the memory system 100 if the address read is greater than the highest address of the main memory 102, and otherwise passes the application data received from the main memory 102 to the output of the memory system 100.

The data path controller 114 is coupled to the write data multiplexer 106 and the read data multiplexer 108, and controls routing of data to and from the main memory 102 and the auxiliary memory 104 based on the operational mode of the memory system 100, and the address being accessed. The data path controller 114 may activate the redundancy calculator 110 and redundancy checker 112 when the memory system 100 is operating in redundancy mode, and may deactivate the redundancy calculator 110 and the redundancy checker 112 when the memory system 100 is operating in extension mode. When the memory system 100 is operating in the redundancy mode, the data path controller 114 sets the write data multiplexer 106 to pass application data to the main memory 102 for storage, to pass redundancy data generated by the redundancy calculator 110 to the auxiliary memory 104 storage, to pass application data read from the main memory 102 to the output of the memory system 100, and to pass redundancy data read from the auxiliary memory 104 to the redundancy checker 112. When operating in the extension mode, and accessing an address lower than the highest address of the main memory 102, the data path controller 114 sets the write data multiplexer 106 to pass application data to the main memory 102, and sets the read data multiplexer 108 to pass application read from the main memory 102 to the output of the memory system 100. When operating in the extension mode, and accessing an address higher than the highest address of the main memory 102, the data path controller 114 sets the write data multiplexer 106 to pass application to the auxiliary memory 104, and sets the read data multiplexer 108 to pass application read from the auxiliary memory 104 to the output of the memory system 100.

Figure 2:
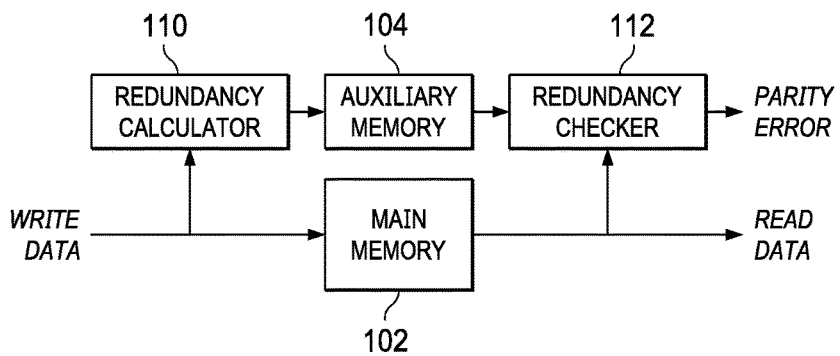
FIG. 2 is block diagram of the memory system of FIG. 1 configured for operation in a redundancy mode.

FIG. 2 is block diagram of the memory system 100 configured for operation in the redundancy mode. When the memory system 100 is operating in the redundancy mode, application data received from circuitry external to the memory system 100 is stored in and read from the main memory 102. For each application data value written to the main memory 102, the redundancy calculator 110 generates redundancy data. The redundancy data is stored in the auxiliary memory 104. Application data read from the main memory 102 is passed to the output of the memory system 100. For each read of application data from the main memory 102, redundancy data is read from the auxiliary memory 104. The redundancy checker 112 applies the redundancy data read from the auxiliary memory 104 to validate the application data read from the main memory 102.

Figure 3:
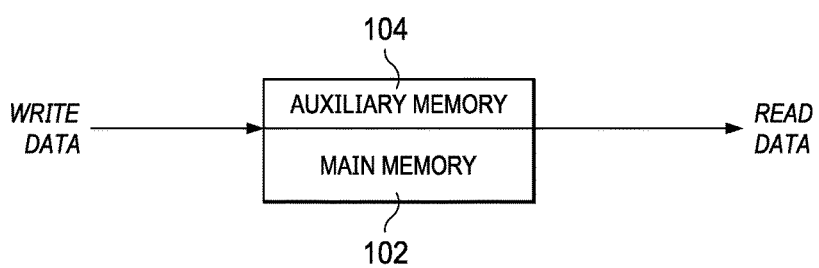
FIG. 3 is a block diagram of the memory system of FIG. 1 configured for operation in an extension mode.

FIG. 3 is a block diagram of the memory system 100 configured for operation in the extension mode. In the extension mode, the auxiliary memory 104 is appended to the main memory 102. Access (e.g., read or write access) to the main memory 102 or the auxiliary memory 104 is selected based on the address to be accessed. Addresses higher than the highest address of the main memory 102 select the auxiliary memory 104 for access, and addresses lower than the highest address of the main memory 102 select the main memory 102 for access.

Figure 4:
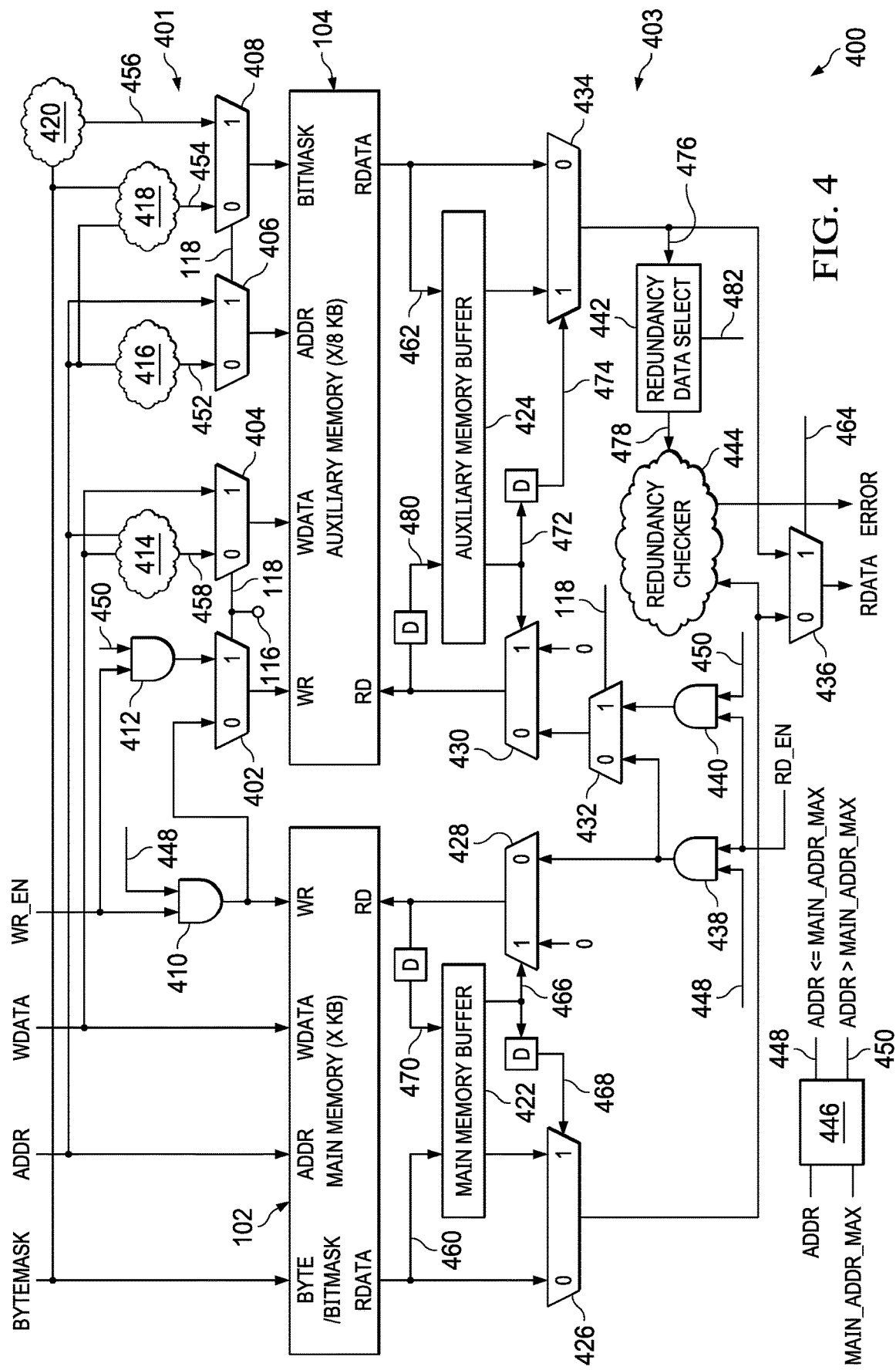
FIG. 4 is a detailed block diagram for an example of the memory system of FIG. 1.

FIG. 4 is a detailed block diagram for an example memory system 400. The memory system 400 is an implementation of the memory system 100. The memory system 400 includes the main memory 102, the auxiliary memory 104, write circuitry 401, and read circuitry 403. The main memory 102 include a write enable input, a write data input, an address input, a mask input, read data output, and a read enable input. The auxiliary memory 104 includes a write enable input, a write data input, an address input, a mask input, read data output, and a read enable input. The mask input of the main memory 102 is coupled to a mask input of the memory system 400, the address input of the memory system 100 is coupled to an address input of the memory system 400. The write data input is coupled to a write data input of the memory system 400.

The write circuitry 401 includes a multiplexer 402, a multiplexer 404, a multiplexer 406, a multiplexer 408, a logic gate 410, a logic gate 412, redundancy calculator circuitry 414, address shift circuitry 416, mask circuitry 418, and mask circuitry 420. The logic gate 410 is coupled to the write enable input of the main memory 102, a write enable input of the memory system 400, and an address comparator 446. The address comparator 446 compares the address currently being accessed (ADDR) to the highest address of the 102 (MAIN_ADDR_MAX). The address comparator 446 generates output signal 448 indicating that ADDR<=MAIN_ADDR_MAX, and output signal 450 indicating that ADDR>MAIN_ADDR_MAX. The logic gate 410 passes a write enable signal to the main memory 102 when the address of the memory system 400 to be accessed is less than or equal to the highest address of the main memory 102.

The output of the multiplexer 402 is coupled to the write enable input of the auxiliary memory 104. The inputs of the multiplexer 402 are coupled to the output of the logic gate 410, and the output of the logic gate 412. A control input of the multiplexer 402 is coupled to extension control terminal 116. If the memory system 400 is operating in redundancy mode, the multiplexer 402 passes the output of the logic gate 410 to the write enable input of the auxiliary memory 104. The logic gate 412 passes a write enable signal to the multiplexer 402 when the address of the memory system 400 to be accessed is greater than the highest address of the main memory 102. If the memory system 400 is operating in extension mode, the multiplexer 402 passes the output signal of the logic gate 412 to the write enable input of the auxiliary memory 104.

The output of the multiplexer 404 is coupled to the write data input of the auxiliary memory 104. The inputs of the multiplexer 404 are coupled to the write data input of the main memory 102 and the output of the redundancy calculator circuitry 414. The input of the redundancy calculator circuitry 414 is coupled to the write data input of the main memory 102. The control input of the multiplexer 404 is coupled to the extension control terminal 116. If the memory system 400 is operating in redundancy mode, the multiplexer 404 passes the output of the redundancy calculator circuitry 414 (redundancy data 458 generated by the redundancy calculator circuitry 414) to the write data input of the auxiliary memory 104. If the memory system 400 is operating in extension mode, the multiplexer 404 passes the write data received by the memory system 400 (from external circuitry) to the write data input of the auxiliary memory 104.

The multiplexer 406 is an address selector. The output of the multiplexer 406 is coupled to the address input of the auxiliary memory 104. The inputs of the multiplexer 406 are coupled to the address input of the main memory 102 and the output of the address shift circuitry 416. The input of the address shift circuitry 416 is coupled to the address input of the main memory 102. The control input of the multiplexer 406 is coupled to the extension control terminal 116. If the memory system 400 is operating in redundancy mode, the multiplexer 406 routes the output of the address shift circuitry 416 (e.g., the shifted address 452—the address right shifted by 3 bits by the address shift circuitry 416) to the address input of the auxiliary memory 104. More generally, the address output by the address shift circuitry 416 may be defined as:

$$\text{ShiftAddr} = \text{Addr} \gg \text{Log 2}(\text{WordWidth}/\text{RedundancyDataWidth})$$

where:
WordWidth is the number of bits in a row of the main memory 102 or the auxiliary memory 104; and
RedundancyDataWidth is the number of bits of the redundancy data generated by the redundancy calculator circuitry 414.

The address shift circuitry 416 is a shift circuit that right shifts the address to account for the multiple rows of the main memory 102 corresponding to redundancy data stored in a single row of the auxiliary memory 104. If the memory system 400 is operating in extension mode, the multiplexer 404 passes the address received by the memory system 400 (the unshifted address to which application data is to be written) to the address input of the auxiliary memory 104.

The multiplexer 408 is a mask selector that selects a mask for provision to the auxiliary memory 104. The output of the multiplexer 408 is coupled to the mask input of the auxiliary memory 104. The inputs of the multiplexer 404 are coupled to the output of the mask circuitry 418 and the output of the mask circuitry 420. The inputs of the mask circuitry 418 are coupled to the mask input and the address input of the main memory 102. The mask circuitry 418 generates a bit mask for writing redundancy data to the auxiliary memory 104 based on the address of the main memory 102 to be written and the mask value defining the bytes to be written at the address. The mask circuitry 420 generates a bit mask for writing application data to the auxiliary memory 104 based on the mask value received by the memory system 400. The input of the mask circuitry 420 is coupled to the mask input of the main memory 102. The control input of the mask circuitry 420 is coupled to the extension control terminal 116. If the memory system 400 is operating in redundancy mode, the mask circuitry 420 passes the output of the mask circuitry 418 (a mask value 454 generated by the mask circuitry 418) to the mask input of the auxiliary memory 104. If the memory system 400 is operating in extension mode, the multiplexer 408 passes the output of the mask circuitry 420 (a mask value 456 generated by the mask circuitry 420) to the mask input of the auxiliary memory 104.

The read circuitry 403 includes a main memory buffer 422, an auxiliary memory buffer 424, a multiplexer 426, a multiplexer 428, a multiplexer 430, a multiplexer 432, a multiplexer 434, a multiplexer 436, a logic gate 438, a logic gate 440, a redundancy data selector 442, and a redundancy checker 444. The main memory buffer 422 is coupled to the read data output of the main memory 102, and stores a last read row fetched from the main memory 102 to allow for power savings if one or more bytes are read from a row stored in the main memory buffer 422. That is, the main memory 102 need not be read if an addressed row is stored in the main memory buffer 422. Similarly, the auxiliary memory buffer 424 is coupled to the read data output of the auxiliary memory 104, and stores a last read row fetched from the auxiliary memory 104 to reduce the number of accesses to the auxiliary memory 104. For example, the main memory buffer 422 and the auxiliary memory buffer 424 may reduce the number of accesses to the main memory and the auxiliary memory 104 by a factor of eight in some applications.

The multiplexer 426 selects read data 460 from the main memory 102 or read data from the main memory buffer 422 for output. The inputs of the multiplexer 426 are coupled to the read data output of the main memory 102 and the read data output of the main memory buffer 422. The control input of the multiplexer 426 is coupled to a buffer match comparator (not shown) of the main memory buffer 422 (via a delay circuit that provides a delayed buffer match signal 468) that compares the address of the row stored in the main memory buffer 422 to the address of a current read access to determine whether the requested data is stored in the main memory buffer 422. If the requested data is stored in the main memory buffer 422, then the multiplexer 426 passes the read data provided from the main memory buffer 422. If the requested data is not stored in the main memory buffer 422, then the addressed row is read from the main memory 102 and stored in the main memory buffer 422, and the read data output by the main memory 102 is passed by the multiplexer 426.

The multiplexer 428 controls read access to the main memory 102 and write access to the main memory buffer 422 based on the output signal 466 of a buffer match comparator (not shown) included in the main memory buffer 422. The output signal 466 indicates whether an addressed row is stored in the main memory buffer 422 (ADDR=BUFF_ADDR). If the addressed row is stored in the main memory buffer 422, then no read access of the main memory 102 is performed. The output of the multiplexer 428 is coupled to the read enable input of the main memory 102 and the write enable input of the main memory buffer 422. If the main memory 102 is read, then the main memory buffer is written based on a delayed read enable signal 470. The control input of the multiplexer 428 is coupled to the buffer match comparator (not shown). An input of the multiplexer 428 is coupled to the output of the logic gate 438. The multiplexer 428 passes a read enable signal if the data at the address to be accessed is not stored in the main memory buffer 422.

The multiplexer 430 and the multiplexer 432 control propagation of read enable signals to the auxiliary memory 104. The multiplexer 432 includes an input coupled to the output of the logic gate 438, and an input coupled to the output of the logic gate 440. The logic gate 440 passes the read enable signal if the address to be accessed is higher than the highest address of the main memory 102. The multiplexer 432 passes the output of the logic gate 440 if the memory system 400 is operating in extension mode, and otherwise passes the output of the logic gate 438. The control input of the multiplexer 432 is coupled to the extension control terminal 116. The multiplexer 430 passes the read enable signal from the multiplexer 432 to the auxiliary memory 104 if the addressed data is not currently stored in the auxiliary memory buffer 424. The read enable signal provided by the multiplexer 430 is delayed to produce an auxiliary buffer write enable signal 480. The control input of the multiplexer 430 is coupled to a buffer address comparator (not shown) included in the auxiliary memory buffer 424 that compares the address of the data stored in the auxiliary memory buffer 424 to the address to be accessed to generate a control signal 472 (ADDR=BUF_ADDR).

The multiplexer 434 selects read data 462 from the auxiliary memory 104 or read data from the auxiliary memory buffer 424 for auxiliary read data 476. The inputs of the multiplexer 434 are coupled to the read data output of the auxiliary memory 104 and the read data output of the auxiliary memory buffer 424. The control input of the multiplexer 434 is coupled to a buffer address comparator (not shown) of the auxiliary memory buffer 424 via a delay circuit that provides a delayed buffer match signal 474. If the requested data is stored in the auxiliary memory buffer 424, then the multiplexer 434 passes the read data provided from the auxiliary memory buffer 424. If the requested data is not stored in the auxiliary memory buffer 424, then the addressed row is read from the auxiliary memory 104 and stored in the auxiliary memory buffer 424, and the read data output by the auxiliary memory 104 is passed by the multiplexer 434.

The output of the multiplexer 434 is coupled to the redundancy data selector 442 and the multiplexer 436. The redundancy data selector 442 selects, based on a delayed address 482 (e.g., a latched version of ADDR), the bits 478 of the redundancy data needed for validation of data read from the main memory 102, and passes the selected redundancy data to the redundancy checker 444. The redundancy checker 444 is coupled to the output of the multiplexer 426, and recomputes the redundancy data based on the read data received from the multiplexer 426 to determine whether the read data has changed while stored in the main memory 102. The redundancy checker 444 may activate an error signal if the validation fails or correct the read data if the redundancy data is an error correction code.

The multiplexer 436 is an output selector that selects data from one of the main memory 102 or the auxiliary memory 104 to provide to the output of the memory system 400. The multiplexer 436 includes inputs that are coupled to the output of the multiplexer 426 and the output of the multiplexer 434. The output of the multiplexer 436 provides the read data output for the memory system 400. The control input of the multiplexer 436 is coupled to output selection logic (not shown) that selects the read data passed by the multiplexer 426 or the read data passed by the multiplexer 434 for output based on a control signal 464. The control signal 464 may be defined as: EXTENSION && (ADDR>MAIN_ADDR_MAX). If the memory system 400 is operating in extension mode, and the address being accessed in higher than the highest address of the main memory 102, then the multiplexer 436 passes the read data received from the multiplexer 434. Otherwise, the multiplexer 436 passes the read data received from the multiplexer 426.

Figure 5:
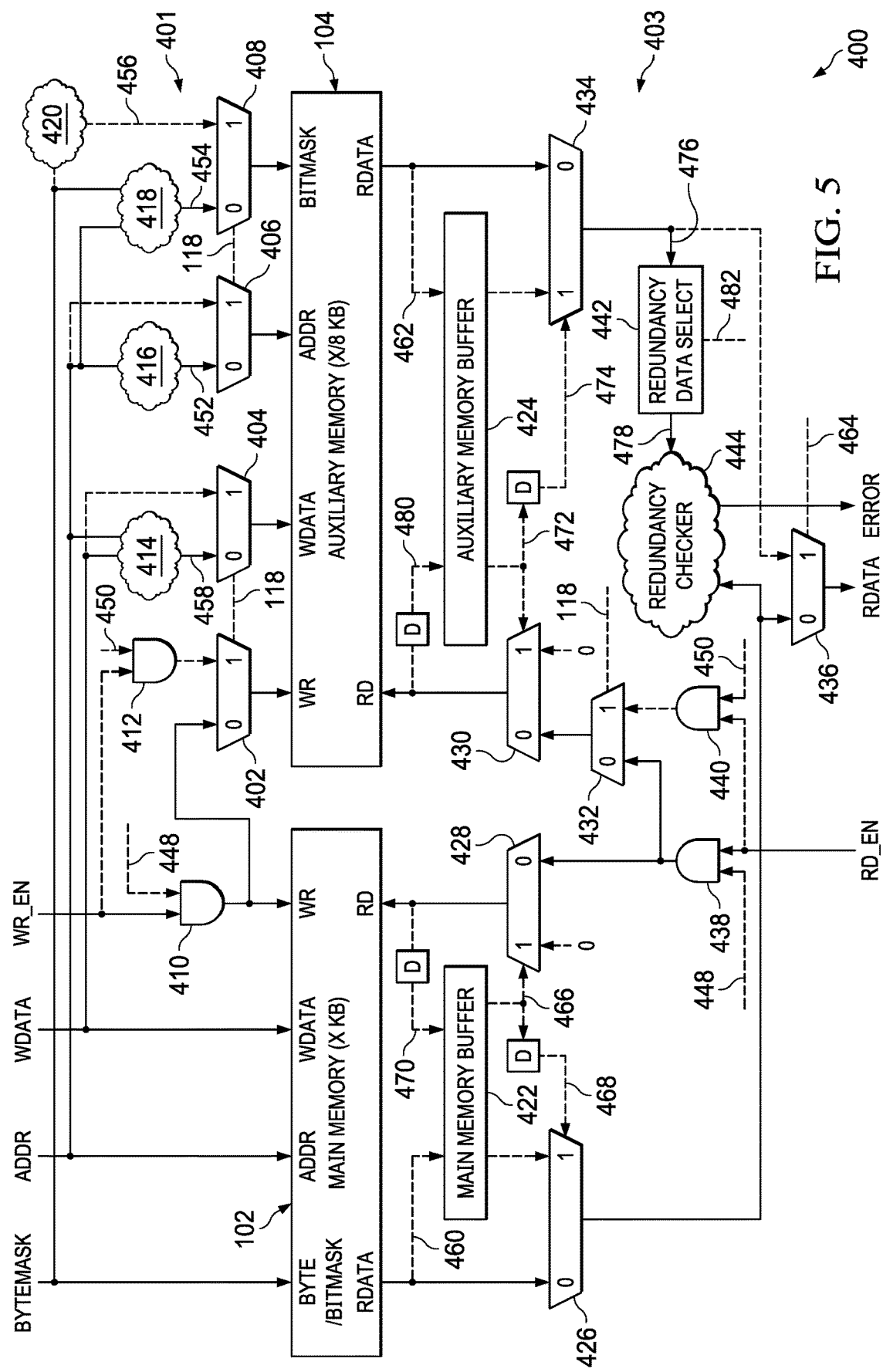
FIG. 5 shows address and data flow in the memory system of FIG. 4 configured for operation in redundancy mode.

FIG. 5 shows address and data flow in the memory system 400 when configured for operation in redundancy mode. The selected data and control flow paths for redundancy mode operation are shown in solid lines. To highlight the selected data and control flow paths, other signals in the memory system 400 are shown as dashed lines. In the example of FIG. 5, read data is fetched from the main memory 102 and the auxiliary memory 104, rather than from the main memory buffer 422 and the auxiliary memory buffer 424.

Figure 6:
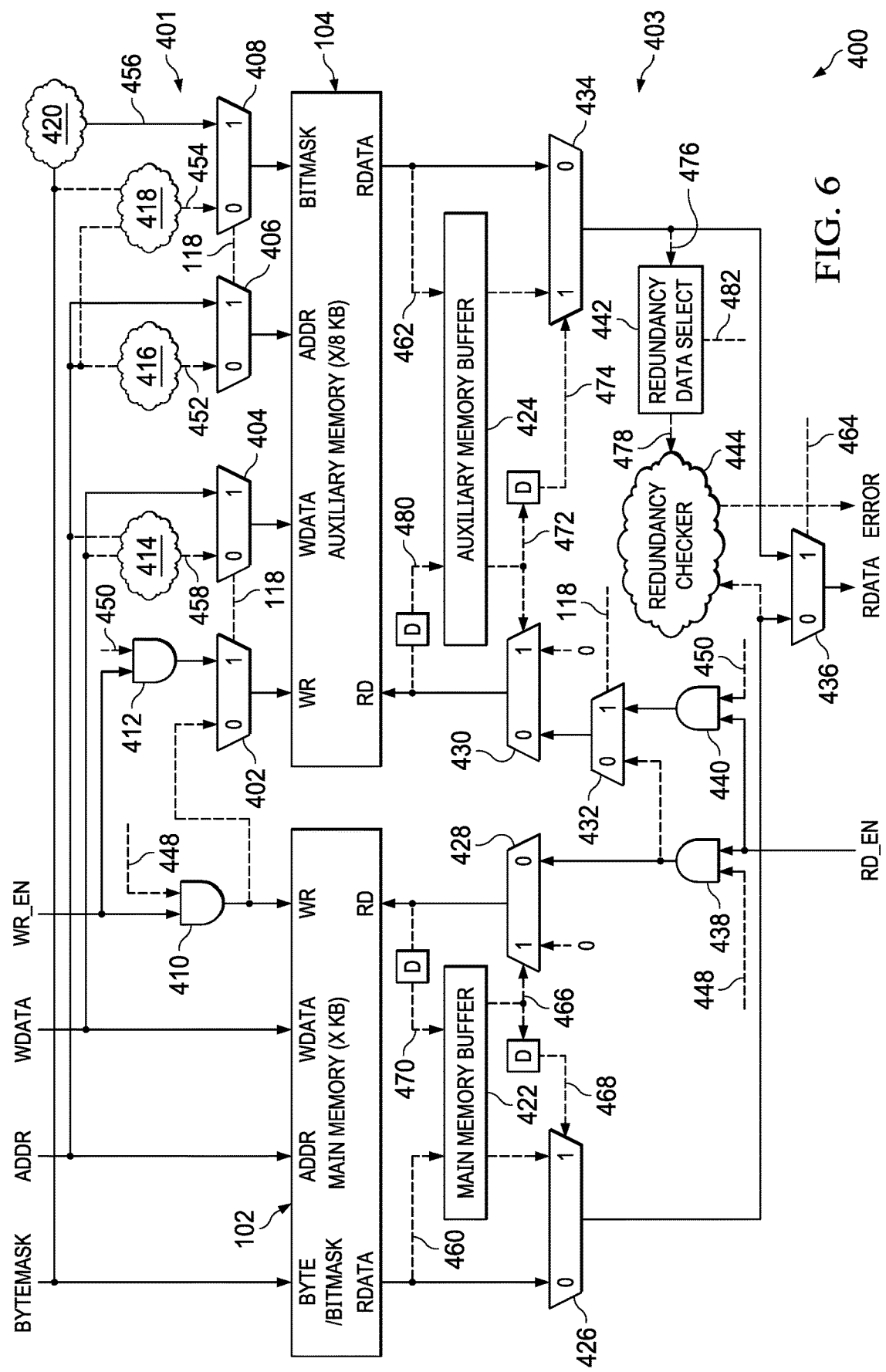
FIG. 6 shows address and data flow in the memory system of FIG. 4 configured for operation in extension mode.

FIG. 6 shows address and data flow in the memory system 400 when configured for operation in extension mode. The selected data and control flow paths for extension mode operation are shown in solid lines. To highlight the selected data and control flow paths, other signals in the memory system 400 are shown as dashed lines. In FIG. 6, read data is shown as fetched from the main memory 102 and the auxiliary memory 104, rather than from the main memory buffer 422 and the auxiliary memory buffer 424.

Figure 7:
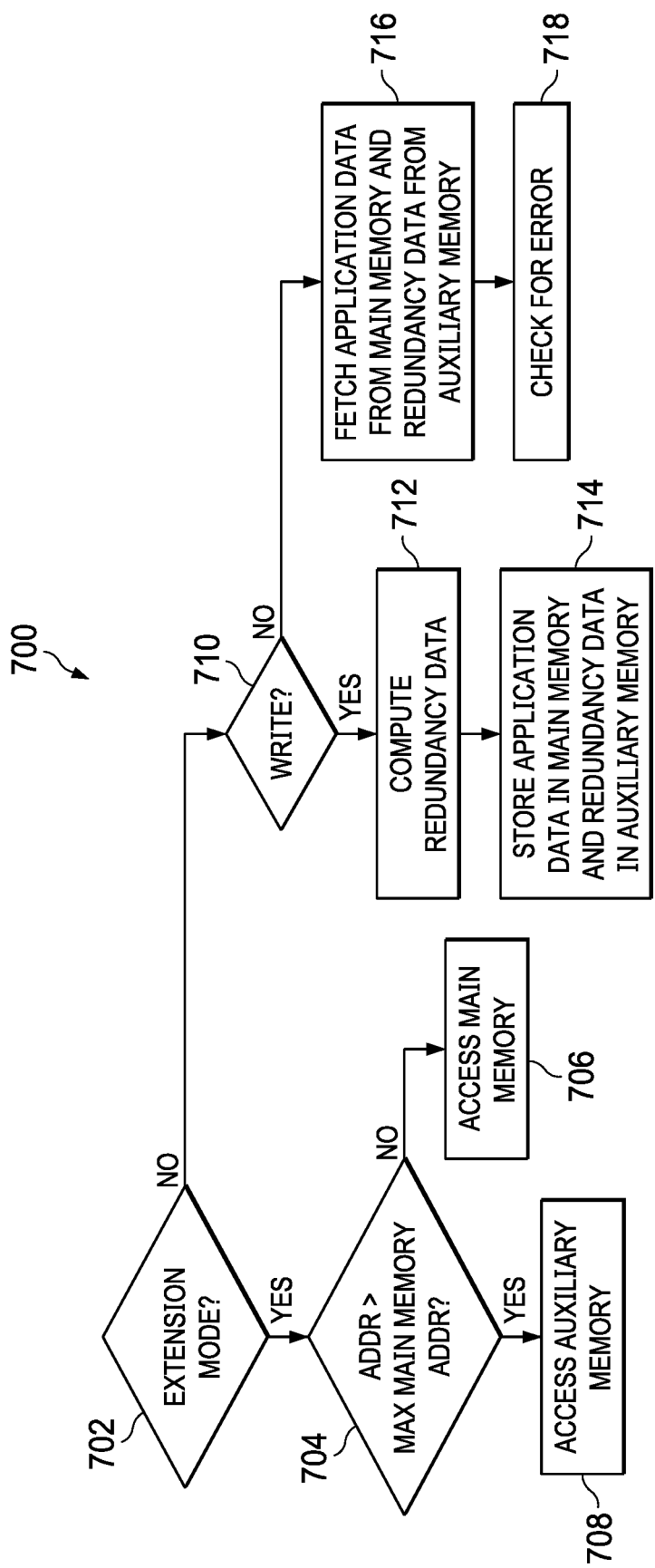
FIG. 7 is a flow diagram for an example method for selectably operating a memory system in a redundancy mode or an extension mode.

FIG. 7 is a flow diagram for an example method 700 for selectably operating a memory system in a redundancy mode or an extension mode. Though depicted sequentially as a matter of convenience, at least some of the actions shown can be performed in a different order and/or performed in parallel. Additionally, some implementations may perform only some of the actions shown. Operations of the method 700 may be performed by an implementation of the memory system 100 or the memory system 400.

In block 702, the memory system 400 determines whether extension mode operation or redundancy mode operation has been selected. In various implementations, the operational mode (extension or redundancy) may be selected by the manufacturer of the memory system 400 or by the user of the memory system 400.

If the memory system 400 is operating in extension mode, then when a memory system access cycle is executed, the memory system 400 determines, in block 704, whether the address to be accessed is greater than the highest address of the main memory 102. If the address to be accessed is not greater then the highest address of the main memory 102, then the memory system 400 accesses (writes or reads) the main memory 102 in block 708. If the address to be accessed is greater than the highest address of the main memory 102, then the memory system 400 access the auxiliary memory 104 in block 706.

If the memory system 400 is operating in redundancy mode (not extension mode), then the memory system 400 determines whether the requested access is a write in block 710. If the requested access is a write, then in block 712, the memory system 400 computes redundancy data for the data to be written.

In block 714, the memory system 400 writes the redundancy data computed in block 712 to the auxiliary memory 104, and writes the data used to compute the redundancy data to the main memory 102.

If the requested access is a read, then, in block 716, the memory system 400 retrieves the read data from the access address of the main memory 102, and retrieves the corresponding redundancy data from the auxiliary memory 104. When operating in the redundancy mode, the address applied to the auxiliary memory 104 may be right shifted by a predetermined number of bits for use in addressing the auxiliary memory 104.

In some implementations of the method 700, the data read from the main memory 102 and/or the auxiliary memory 104 may be stored in the main memory buffer 422 and auxiliary memory buffer 424, and read data may be provided from the main memory buffer 422 and the auxiliary memory buffer 424 rather than from the main memory 102 and the auxiliary memory 104.

In block 718, the memory system 400 applies the data read from the main memory 102 and the auxiliary memory 104 to check for errors in the data read from the main memory 102.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

Circuits described herein are reconfigurable to include additional or different components to provide functionality at least partially similar to functionality available prior to the component replacement.

Modifications are possible in the described embodiments, and other embodiments are possible, within the scope of the claims.

What is claimed is:

1. A memory system, comprising:
    a main memory having a line width, and including a write data input;
    an auxiliary memory having the line width, and including a write data input;
    a redundancy circuit including:
        an input coupled to the write data input of the main memory; and
        an output;
    an extension control terminal; and
    a multiplexer including:
        a first input coupled to the write data input of the main memory;
        a second input coupled to the output of the redundancy circuit;
        a control input coupled to the extension control terminal; and
        an output coupled to the write data input of the auxiliary memory.

2. The memory system of claim 1, wherein:
    the main memory includes an address input;
    the auxiliary memory includes an address input;
    the multiplexer is a first multiplexer; and
    the memory system includes:
        a shifting circuit including:

an input coupled to the address input of the main memory; and
an output; and
a second multiplexer including:
a first input coupled to the address input of the main memory;
a second input coupled to the output of the shifting circuit;
a control input coupled to the extension control terminal; and
an output coupled to the address input of the auxiliary memory.

3. The memory system of claim 2, wherein:
the main memory includes a mask input;
the auxiliary memory includes a mask input; and
the memory system includes:
a third multiplexer having:
a first input coupled to the mask input of the main memory;
a second input coupled to the address input of the main memory;
a control input coupled to the extension control terminal; and
an output coupled to the mask input of the auxiliary memory.

4. The memory system of claim 2, wherein:
the auxiliary memory includes a read enable input; and
the memory system includes:
an address comparator having:
an input coupled to the address input of the main memory;
a first output; and
a second output;
a first logic gate including:
an input coupled to the first output of the address comparator; and
an output;
a second logic gate including:
an input coupled to the second output of the address comparator; and
an output; and
a third multiplexer having:
a first input coupled to the output of the first logic gate;
a second input coupled to the output of the second logic gate;
a control input coupled to the extension control terminal; and
an output coupled to the read enable input.

5. The memory system of claim 2, wherein:
the main memory includes a write enable input;
the auxiliary memory includes a write enable input;
the multiplexer is a first multiplexer;
the memory system includes:
an address comparator having:
an input coupled to the address input of the main memory; and
an output; and
a third multiplexer including:
a first input coupled to the write enable input of the main memory;
a second input coupled to the output of the address comparator;
a control input coupled to the extension control terminal; and
an output coupled to the write enable input of the auxiliary memory.

6. The memory system of claim 1, wherein:
the auxiliary memory includes a read data output;
the multiplexer is a first multiplexer; and
the memory system includes:
a read data output;
a memory buffer including:
an input coupled to the read data output of the auxiliary memory; and
an output; and
a second multiplexer including:
a first input coupled to the output of the memory buffer;
a second input coupled to the read data output of the auxiliary memory; and
an output coupled to the read data output of the memory system.

7. The memory system of claim 6, wherein:
the main memory includes a read data output; and
the memory system includes:
a third multiplexer having:
a first input coupled to the output of the memory buffer;
a second input coupled to the read data output of the main memory; and
an output coupled to the read data output of the memory system.

8. The memory system of claim 7, wherein:
the memory buffer is a first memory buffer; and
the memory system includes:
a second memory buffer including:
an input coupled to the read data output of the main memory; and
an output coupled to the second input of the third multiplexer.

9. A memory system, comprising:
a main memory;
an auxiliary memory;
a redundancy circuit configured to:
receive application data, wherein the application data is associated with an address; and
generate redundancy data based on the application data; and
a data selector configured to:
receive the application data and the redundancy data;
responsive to selection of a redundancy mode, route the application data to the main memory and the redundancy data to the auxiliary memory; and
responsive to selection of an extension mode, route the application data to the main memory or the auxiliary memory based on the address of the application data.

10. The memory system of claim 9, wherein a line width of the auxiliary memory is equal to a line width of the main memory.

11. The memory system of claim 9, further comprising:
a shifting circuit, configured to shift the address by a predetermined number of bits to produce a shifted address; and
an address selector coupled to the auxiliary memory, and configured to:
route the shifted address to the auxiliary memory responsive to selection of the redundancy mode; and
route the address to the auxiliary memory responsive to selection of the extension mode.

12. The memory system of claim 11, further comprising:
a mask selector coupled to the auxiliary memory, and configured to:

route a first mask value to the auxiliary memory responsive to selection of the redundancy mode; and
route a second mask value to the auxiliary memory responsive to selection of the extension mode.

13. The memory system of claim 9, further comprising:
a write enable selector coupled to the auxiliary memory, and configured to:
route a write enable signal to the auxiliary memory responsive to selection of the redundancy mode and the address being no more than a predetermined value; and
route the write enable signal to the auxiliary memory responsive to selection of the extension mode and the address being greater than the predetermined value.

14. The memory system of claim 9, further comprising:
an output selector coupled to the main memory and the auxiliary memory, and configured to:
responsive to a command to read a data, route the data read from the main memory to an output of the memory system responsive to an address of the data being no more than a predetermined value; and
route the data read from the auxiliary memory to the output of the memory system responsive to selection of the extension mode and the address of the data being greater than the predetermined value.

15. The memory system of claim 9, further comprising:
a memory buffer coupled to the auxiliary memory, and configured to store a line of data read from the auxiliary memory.

16. A method, comprising:
receiving, at a redundancy circuit, application data associated with an address;
generating, by the redundancy circuit, redundancy data based on the application data;
receiving, at a data selector, the application data and the redundancy data; and
determining, by the data selector, based on whether a redundancy mode or an extension mode is selected, whether to:
cause the application data to be provided to a main memory and the redundancy data to be provided to an auxiliary memory; or
further determine whether to provide the application data to the main memory or the auxiliary memory based on the address associated with the application data.

17. The method of claim 16, further comprising:
shifting the address by a predetermined number of bits to produce a shifted address; and
determining whether to:
provide the shifted address to the auxiliary memory responsive to selection of the redundancy mode; or
provide the address to the auxiliary memory responsive to selection of the extension mode.

18. The method of claim 16, further comprising:
storing a value read from the auxiliary memory in a memory buffer; and
determining whether to:
provide the value from the memory buffer to an output of a memory system based on the value being stored in the memory buffer; or
provide the value from the auxiliary memory to the output of the memory system based on the value not being stored in the memory buffer.

19. The method of claim 18, further comprising determining whether to:
provide a value read from the main memory to an output of the memory system based on an address value being no more than a predetermined value; or
provide a value read from the auxiliary memory to the output of the memory system based on the address value being greater than the predetermined value and selection of the extension mode.

20. The method of claim 16, wherein providing, by the data selector responsive to selection of the extension mode, the application data to the main memory or the auxiliary memory based on the address of the application data further comprises:
determining whether the address of the application data is more than a predetermined value;
determining, based on whether the address of the application data is more than the predetermined value, whether to:
provide the application data to the main memory; or
provide the application data to the auxiliary memory.

* * * * *